United States Patent [19]

Rieder et al.

[11] Patent Number: 4,879,671
[45] Date of Patent: Nov. 7, 1989

[54] DIGITAL MEASUREMENT OF RELATIVE DISPLACEMENT USING STORED CORRECTION ADDRESS DATA

[75] Inventors: Heinz Rieder, St. Pantaleon; Max Schwaiger, Ostermiething, both of Austria

[73] Assignee: RSF - Elektronik Gesellschaft m.b.H., Tarsdorf, Fed. Rep. of Germany

[21] Appl. No.: 273,171

[22] Filed: Nov. 14, 1988

Related U.S. Application Data

[63] Continuation of Ser. No. 96,252, Sep. 8, 1987, abandoned, which is a continuation of Ser. No. 750,528, Jun. 28, 1985, abandoned.

[30] Foreign Application Priority Data

Jul. 3, 1984 [AT] Austria .................................. 2139/84

[51] Int. Cl.⁴ ..................... G01B 11/02; G01B 21/02; G01C 25/00; G06F 11/00
[52] U.S. Cl. ............................... 364/562; 364/571.01; 364/571.07; 364/900; 250/231 SE; 356/373; 356/387
[58] Field of Search ............... 364/200, 900, 560, 562, 364/563, 571.01, 571.07; 250/237 G, 231 SE; 356/373, 374, 395, 387; 33/125 C

[56] References Cited

U.S. PATENT DOCUMENTS

| | | | |
|---|---|---|---|
| 3,555,254 | 1/1971 | Gerber | 364/170 X |
| 3,618,073 | 11/1971 | Domchick | 340/347.54 |
| 3,668,377 | 6/1972 | Inaba et al. | 364/571 |
| 4,082,463 | 4/1978 | Dehait et al. | 356/387 |
| 4,110,828 | 8/1978 | Baumgartner et al. | 364/571 |
| 4,200,934 | 4/1980 | Hofmann | 364/571 |
| 4,250,555 | 2/1981 | Mitchell et al. | 364/571 |
| 4,306,220 | 12/1981 | Schwefel et al. | 250/237 G |
| 4,335,306 | 6/1982 | Gort et al. | 250/231 SE |
| 4,414,754 | 11/1983 | Lapeyre | 33/125 C |
| 4,462,083 | 7/1984 | Schwefel | 364/571 |
| 4,507,647 | 3/1985 | Minami et al. | 250/237 G |
| 4,529,964 | 4/1985 | Minami et al. | 250/231 SE |
| 4,531,200 | 7/1985 | Whitley | 364/900 |
| 4,587,622 | 5/1986 | Herzog | 364/571 |
| 4,716,292 | 12/1987 | Rieder et al. | 250/231 SE X |

FOREIGN PATENT DOCUMENTS 3036830 4/1982 Fed. Rep. of Germany .

OTHER PUBLICATIONS

MC68020 32-Bit Microprocessor User's Manual, Prentice-Hall, Inc., Englewood Cliffs, N.J., 07632, 1984, pp. 2-1 to 2-19.
Manno, Morris M., Computer System Architecture, Prentice-Hall, Inc., Englewood Cliffs, N.J., 1976, 00. 147-150.

Primary Examiner—Felix D. Gruber
Assistant Examiner—Joseph L. Dixon
Attorney, Agent, or Firm—Herbert Dubno

[57] ABSTRACT

A method of digitally measuring displacement increments in which, for the relative displacement of a scanner and a scale having regularly spaced graduations each defining an increment of displacement, correction values and the signals are stored at respective addresses corresponding to the relative displacement and respective locations on the scale, only where the correction exceeds a predetermined threshold value. During the measurement, the measured values, which can correspond to each graduation and to interpolation values between each graduation and the next graduation to be scanned, are corrected with the corrected value addressed as each location is reached.

8 Claims, 2 Drawing Sheets

DIGITAL MEASUREMENT OF RELATIVE DISPLACEMENT USING STORED CORRECTION ADDRESS DATA

This is a continuation of co-pending application Ser. No. 096,252 filed on Sept. 8, 1987 which is a continuation of Ser. No. 750,528 filed June 28, 1985, both now abandoned.

FIELD OF THE INVENTION

This invention relates to a method of digital electric measurement of lengths or angles, in which a scale, particularly an incremental scale, having periodically repeated graduations is scanned. Signals are generated in dependence upon the scanning. The said signals are fed to interpolating means for computing intermediate values and the intermediate values and correction data stored at addresses associated with locations on the scale are used for a computation of measured value. Signals representing these measured values are delivered to indicating and/or control means.

This invention relates also to a method of determining the correcting values. In this respect of the method the scale is scanned by moving the measuring device along the length range or angular range for which the measuring system is designed. The length range or angular range is also transversed with a higher-ranking measuring system having a higher accuracy and a higher resolution than the measuring device. Differences between the results of the measurements thus obtained are stored in a correction data memory.

The invention relates also to a circuit arrangement for carrying out the method of determining correcting values. This circuit can comprise a measuring device for measuring in a range of measurement and has a scanning unit for scanning a scale, which extends throughout the range of measurement. A signal processing unit is provided and includes an interpolating computer, a measured-value computer and a signal generator for delivering signals to a display and/or control unit. A correction data memory is associated with the measured-value computer. A higher-ranking measuring system having a higher accuracy and a higher resolution than the measuring device is operable to perform reference measurements in the range of measurement. A comparator stage computes storable correcting value in dependence on differences between the instantaneous value measured by the measuring device and the value measured by the higher-ranking measuring system.

BACKGROUND OF THE INVENTION

Methods of the kind mentioned alone as well as a suitable circuit arrangement for carrying out the method are basically known from Published German patent application No. 30 36 830, the teachings of which are based on the teachings of German patent specification No. 16 38 032 and of Published German application No. 27 29 657. The use of interpolating means, consisting of an interpolating computer for a computation of intermediate values is known from U.S. Pat. No. 3,618,073.

In theory, aan interpolating computer can be used for a computation by which each of the signal periods, which may represent increments of a scale, can be subdivided as desired so that the desired resolution in the display or processing can be achieved independently of the magnitude of the increments of the scale. It is quite conventional in practice to subdivide the periodic signals obtained by a scanning of an incremental scale by a factor of 100. For this purpose, interpolation tables are prepared and stored and the interpolation table is read at addresses associated with instantaneous magnitudes of the measured-value signal or of a signal obtained by a transformation or correction of the measured-value signal. The stored value is then used as an interpolated value for the further computation or for the display or processing. In most cases, complete signal periods are accumulated by counting means and, where purely incremental scales are used, the direction of the scanning movement is also determined from the analog signals. In absolute systems having a very fine incremental trace, the absolute values are combined in a succeeding device with the interpolated values which have been computed.

In the display or processing, e.g., in control systems for machines, a high resolution will not make sense if the possible accuracy of the display differs excessively in order of magnitude from the accuracy of the measurement which can actually be achieved.

The accuracy of the measurement which can actually be achieved depends, inter alia, on the precision of the scale, on the exact agreement of the direction of the scale and the direction of the scanning movement, on the accuracy of the scanning operation, on the maintenance of the proper phase displacement between the generated signals, on the maintenance of a predetermined waveform and amplitude of the signals and also on external factors, such as defects of the machine tools on which devices on the present kind are used to measure lengths or angles.

In order to compensate such possible errors and to achieve a measurement which is as accurate as possible, the earlier methods of measurement of the type mentioned described above are carried out in such a manner that the signals delivered by the interpolating device are corrected. For this purpose, these signals are combined in the correction data computer with previously stored correcting values. Whereas this method has proved to be useful, it involves a very high cost because in the usual practice a correcting value is stored for each interpolated value which can possibly be obtained throughout the range of measurement. It will be understood that the absolute values of said correcting values may differ from each other and that said absolute values must be stored as corresponding stored values. For this reason, different stored values must be stored at each memory address. Hence the method requires very large and highly expensive memories. Because very large correcting values would be obtained in certain regions of the range of measurement in case of systematic scale errors, i.e., if the actual number of increments along the range of measurement differs from the specified number, it is also known to determine the systematic scale error for each section of the range of measurement and to store for each section of the scale a correcting value determined in dependence on the mean function of the systematic scale error and which is also taken into account in the computation of the values for correcting the measured values. In order to reduce the storage capacity required for scale sections in which similar error functions can be expected, an average error function for each signal period can be assumed for such section and can be taken into account by the storage of a corresponding correcting value in the correction data memory. While this practice will reduce the required memory capacity, the accuracy of the correction will be strongly affected thereby. Specifically, this approach hardly permits of a compensation of errors in measurement which are due to machine defects.

OBJECTS OF THE INVENTION

It is an object of the invention to improve a method of the kind described for a digital electric measurement of lengths and angles so as to improve the actual accuracy of the measurement and to simplify the required apparatus.

Another object of the invention is to provide a suitable method and circuit arrangement for determining the correcting values.

SUMMARY OF THE INVENTION

In a method of the stated kind for a digital electrical measurement of lengths or angles, the invention provides that only correction increment addresses and the signs of the correction increment for each of said addresses are permanently stored for the correction. Correction increments of equal magnitude are associated at least with those addresses which are associated with a given sign. For the correction of a given measured value the corresponding correcting value is computed in dependence on the correction increments corresponding to the correction increment addresses which have been addressed during the scanning movement up to a predetermined or selected point of the scale. If desired, an interpolated value is computed in consideration of the next following correction increment to be addressed as the scanning movement is continued.

An important advantage afforded by the method in accordance with the invention is that a simple address memory can be used and the correcting value to be combined with an interpolated value can be computed by means of the measured-value computer, which is required in any case.

In the simplest case each correctingvalue which is required is determined by the addition of the selected correction increment with the proper sign at each of the addresses which have been addressed until the predetermined or selected point of the scale has been reached.

In dependence on the distribution of the addressed addresses over the length of the scale, a correcting value profile can be computed and interpolated correcting values can be used in scale portions disposed between locations associated with addresses which have already been addressed. For instance, the correction increment may be selected to amount to one-tenth of the resolution of the display of the measuring system. In most cases it will be sufficient to provide a memory address only for each scale increment rather than for each interpolatable intermediate value. Nevertheless it is possible to correct for systematic scale errors as well as for the other errors.

Because a storage with the proper sign is required, the addresses associated with different signs can be stored in different memories.

In the method in accordance with the invention for determining correcting values, an error tolerance is preselected as a correction increment and the memory is at those correction increment addresses which have the proper sign and are associated with those locations of the scale for which the value measured by the higher-ranking measuring system is larger or smaller at least by the correction increment than the instantaneous measured value measured by the measuring device or than the instantaneous value which has been corrected by the correcting value obtained by the addition of the selected correction increment with the proper sign at each of the addresses which have been addressed during the scanning of the scale from a fixed point. Hence the correction increment addresses can be initially stored in a main memory of the higher-ranking measuring system and can then be transferred to a read-only memory of the measuring device.

Particularly in the application of the method to machine tools and robots, the error which occurs in the measurement in dependence on the scanning direction can be taken into account in that the range of measurement is consecutively scanned in mutually opposite directions and the correcting values are stored in dependence on the scanning direction and are read in dependence on the scanning direction. It is even possible to store separate correction increments under load, e.g. when identical workpieces are made in succession on robots, so that a measured value obtained under identical loads may be correspondingly corrected.

A circuit arrangement for carrying out the method of determining correcting values has a comparator stage consisting of a measured-value comparator which has been set for a fixed reference value and which during the scanning of the scale cooperates with a correcting value computer to select correction increment addresses in the correction data memory or in a main memory of the higher-ranking measuring system, which addresses are associated with those points of the scale near which the instantaneous measured value obtained by the measuring device, or that measured value which has been corrected by preceding correcting operations, differs from the measured value obtained from the higher-ranking measuring system, and, if a main memory of a higher-ranking measuring system is used, the correction increment addresses are adapted to be transferred to the correction data memory of the measuring device.

SPECIFIC DESCRIPTION

An incremental measuring device, which may be designed to measure lengths or angles, comprises a scanning unit 1 for scanning an incremental scale 1a, which may be coded or provided with reference marks 1b and which may consist of a length scale or an angular scale (disc or synchro transmitter). The incremental scale may consist of an optically readable scale provided with graduation lines or may be adapted to be scanned by inductive, magnetic or capacitive methods. If an optoelectronic reading is effected by means of reading grids, which are longitudinally offset by fractional parts of a scale increment, and by means of associated photodetectors, such as phototransistors, which are illuminated through the scale and the reading grid, the scanning will result in most cases in the generation of at least two electric analog wave signals, which have basically the form of sine signals and are displaced in phase from each other and have a period length corresponding to the increment of the scale being scanned.

Figure 1:
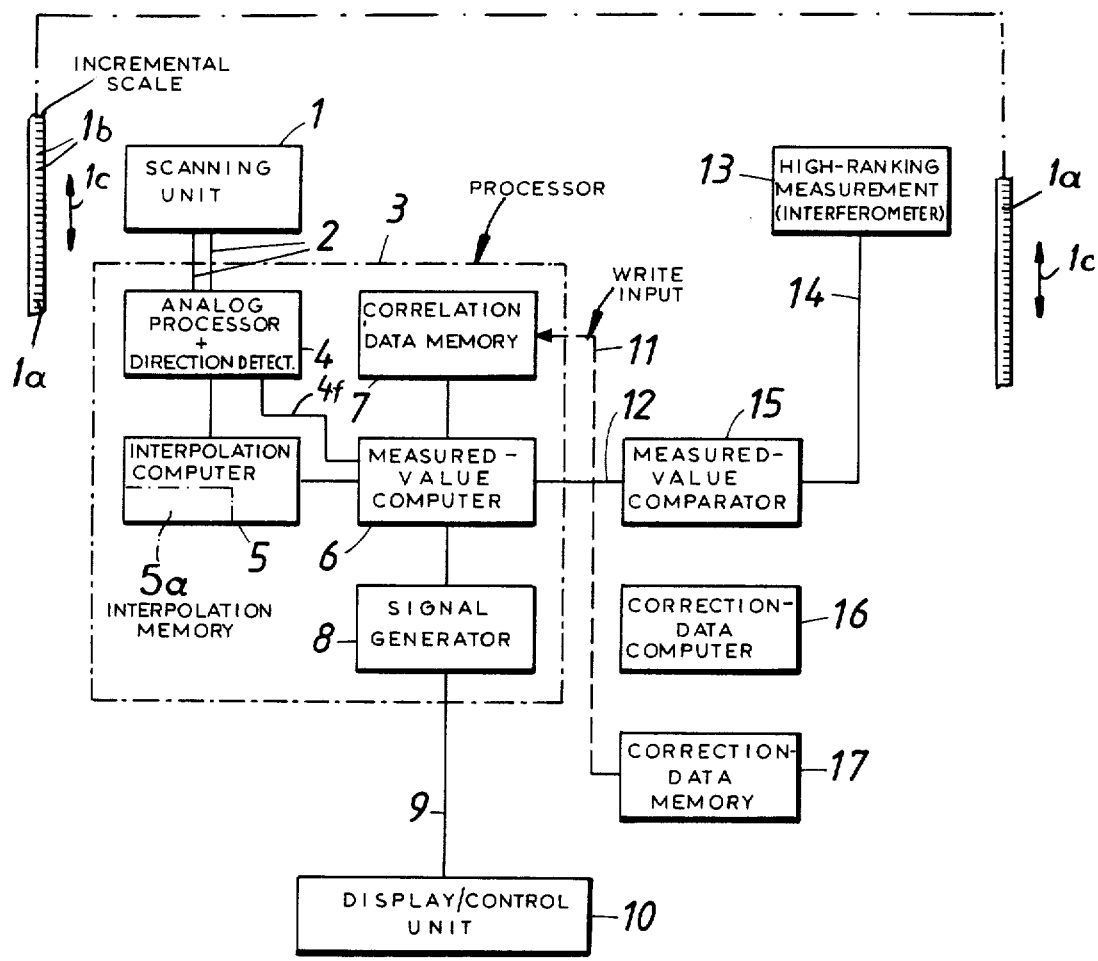
FIG. 1 is a block diagram illustrating a circuit arrangement provided in accordance with the invention and serving to determine the correcting values for use in an incremental measuring device.
Figure 2:
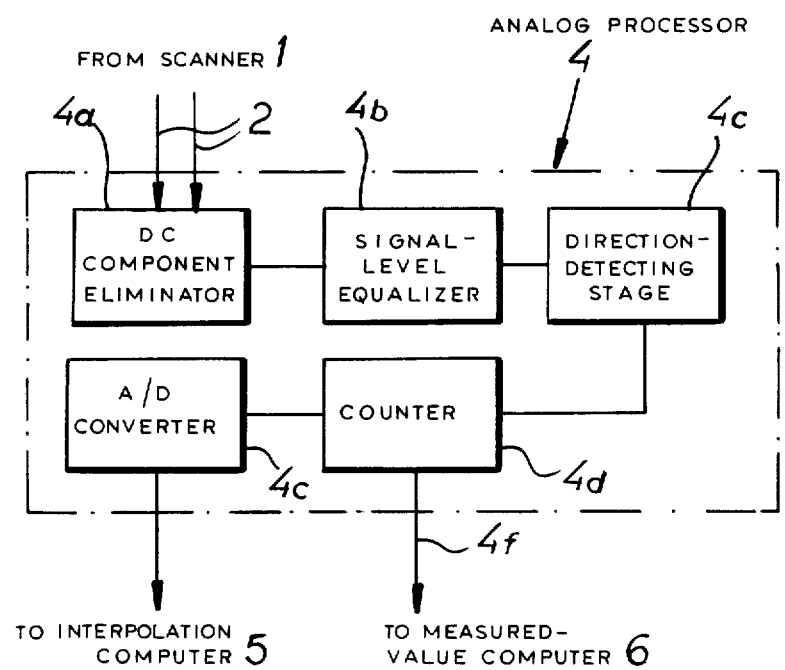
FIG. 2 is a block diagram of a part of FIG. 1.

The signals are delivered by the scanner 1 via lines 2 to a processor 3, which includes an analog section (FIG. 2) 4, in which the signals can be shaped and corrected.

In this case, correcting means an elimination of d.c. voltage components (e.g. at 4a) and an adjustment to equal signal amplitudes and equal phase displacements by the equalizer 4b. Corresponding corrections can also be made in the digital section, which will be described more fully hereinafter. The analog section 4 includes also a direction-detecting stage 4a, in which the direction of the movement of the scanning unit relative to the scale is determined by a detection of that of the two wave signals which leads the other. The signals, which may be scaled, and the information indicating the instantaneous direction of the scanning movement are transmitted via multiple lines to the digital section of the processor 3. A counter 4d may be associated with the analog section 4 and may be used to count the number of complete periods of the signals which have been generated, i.e., of the number of scale increments which have been traversed from a reference point or from a selected zero position. Signals indicating the counts obtained are also transmitted to the digital section via line 4f. The analog signals are digitalized by an analog-to-digital converter 4e.

The digital signals are transmitted to an interpolation computer 5, which performs interpolating computations throughout the length of each signal period and computes interpolated values from signal values which are applied. That interpolation computer cooperates in most cases with an interpolation memory 5a and arithmetically divides the scale increments with the aid of the wave signals.

The results of the interpolating computations are transmitted to a measured-value computer 6, which is preferably supplied also with the count-indicating signals transmitted from the analog section 4 and which computes a measured value from the count-indicating signals and from the interpolated values.

For this computation of the measured value, correcting values are also delivered to the measured-value computer 6 from a correction data memory 7.

In the embodiment shown by way of example, the information stored in the correction data memory consists only of addresses which are associated with those increments or fractional parts of increments of the scale at which a correction by a predetermined value is required, and of the information indicating the sign associated with each address.

From the system for measuring lengths and from the interpolation computer 5, and possibly also from the counter 4d the measured-value computer 6 is supplied with information indicating the instantaneous location of the scanning unit at the scale.

The measured-value computer is also supplied from the memory 7 with information indicating for each sign the number of the associated addresses which have been addressed during the scanning movement between a fixed point of the scale and the location at which the scale is instantaneously scanned, and, if desired, with information on the distance from that location to the next following location corresponding to a correction increment address and the sign associated with such address.

In dependence on such information the computer 6 computes a correcting value and combines said correcting value with the associated information obtained by the measurement and generates output signals which have been corrected in accordance with the stored value that has been applied.

The measured-value computer 6 controls a signal generator 8, the output signals of which are delivered by a line 9 to a display or control unit 10 and are possibly used to control said unit.

For the storage of the addresses in the correcting value memory 7, the latter has a write input 11 and the measured-value computer 6 is provided with an additional output 12.

A higher-ranking measuring system 13 having a higher accuracy and a higher resolution than the measuring device is installed along the path at which the measurement is to be effected and is used to measure along said path parallel to the present measuring system. For a length measurement, this system 13 can include a laser interferometer installed along the path at which the measurement is to be effected.

The measured-value output 14 of the interferometer 13 and the output 12 of the measured-value computer 6 are connected to a measured-value comparator 15, which is set to a predetermined threshold value, e.g. to a fixed value amounting to 10% of the smallest increment which can be arithmetically obtained by interpolation.

The path along which the measurement is effected is traversed (arrow 1c) and is measured simultaneously with the length-measuring device including the scanning unit 1 and with the interferometer 13.

Whenever an error in excess of the threshold value occurs, the measured-value comparator 15 delivers an error signal, which by means of a correction data computer 16 is stored in a correction data memory 17 as an address which is associated with that location of the scale at which the error signal has occurred.

The information stored in the memory 17 indicates only that information has been stored at that address and the sign associated with that information is also defined, e.g by the use of different memory units for the two signs.

When the path along which the measurement is to be performed has been traversed once, the correction increment addresses have been stored in the correction data memory 17. Additional correction increment addresses can be stored during a scanning movement in the opposite direction and when the machine or a robot provided with the measuring system is operated under load. The locations where a correction is required, which locations are indicated by the stored addresses, and the corrections required at said locations, are taken into account in the measured-value computer 6 or in the correction data computer 16 in such a manner that the measured-value comparator effects in each case a comparison of the measured-value signal from the measured-value computer 6, which signal has been corrected in dependence of all correcting increments previously applied, with the exception of the correction increment associated with the address that has been stored last, and the value measured by the laser interferometer 13. The contents of the memory 17 are finally transferred to the correcting value memory 7.

In one embodiment, the output data of the correction data computer 16 could be stored directly in the correction data memory 17 although a more expensive memory in the measuring system 3 will be required in that case.

We claim:

1. A method of digitally measuring displacement increments with automatic correction which comprises the steps of:
(a) relatively displacing a scale having periodically repeating graduations separated by fixed increments and a scanner responsive to said scale and determining locations along said scale at which correction increments for measured displacement are necessary for respective positions of relative displacement of said scanner and said scale which exceed a predetermined threshold measurement error;
(b) storing in a correction data memory addresses corresponding to said locations of necessary scale correction increments for measured displacement which exceed said predetermined threshold measurement error at respective addresses for the scale locations corresponding to said positions and storing a plus or a minus sign for each said scale correction increment representing whether said scale correction increment lies respectively above or below a measured displacement by providing a respective plus and a respective minus address memory and storing each said correction address only in the plus address memory when said scale correction increment lies above said measured displacement and only in the minus address memory when said scale correction increment lies below said measured displacement;
(c) following said correction determination, displacing said scale and said scanner relatively and generating signals representing the latter relative displacement and movement past said locations;
(d) generating from said signals an output value corresponding to the successive scanning of said graduations, thereby forming a succession of measured values associated with successive locations of the scale which are scanned;
(e) reading from said correction data memory addresses corresponding to respective scale correction increments stored for each said scale location at which the respective scale correction increment exceeded said predetermined threshold measurement error;
(f) correcting said respective scale correction increments for a particular said address for a respective location, the corresponding measured value; and
(g) outputting the measured value of the displacement corrected as in step (f).

2. A method of digitally measuring displacement increments with automatic correction which comprises the steps of:
(a) relatively displacing a scale having periodically repeating graduations separated by fixed increments and a scanner responsive to said scale and determining locations along said scale at which correction increments for measured displacement are necessary for respective positions of relative displacement of said scanner and said scale which exceed a predetermined threshold measurement error;
(b) storing in a correction data memory addresses corresponding to said locations of necessary scale correction increments for measured displacement which exceed said predetermined threshold measurement error at respective addresses for the scale locations corresponding to said positions and storing a sign for each said scale correction increment representing whether said scale correction increment lies above or below a measured displacement by providing a respective address memory for each sign and storing each said correction address in the memory of the respective sign;
(c) following said correction determination, displacing said scale and said scanner relatively and generating signals representing the latter relative displacement and movement past said locations;
(d) generating from said signals an output value corresponding to the successive scanning of said graduations and interpolating a value of said output value between each output value corresponding to a graduation scanned and the next graduation to be scanned, thereby forming a succession of measured values associated with successive locations of the scale which are scanned;
(e) reading from said correction data memory addresses corresponding to respective scale correction increments stored for each said scale location at which the respective scale correction increment exceeded said predetermined threshold measurement error;
(f) correcting with respective scale correction increments for a particular said address for a respective location, the corresponding measured value; and
(g) outputting the measured value of the displacement corrected as in step (f).

3. The method defined in claim 2, wherein, in step (a) said scale is scanned by moving the scale and said scanner relatively to generate a series of actual value measurements representing relative displacement, concurrently scanning said scale with a higher ranking measuring system having a higher accuracy and a higher resolution than said scanner, comparing outputs of said scanner and said higher ranking measuring system and generating a scale correction increment representing the difference between a measurement made by said scanner and a measurement made by said system at each said location,
storing only the address of each said scale correction increments which exceed a predetermined threshold error and the sign by which each said scale correction increment lies above or below a measured value derived from said scanner, step (f) including algebraically adding a respective scale correction increment for a particular address corresponding to a respective said location to the corresponding measured value in accordance with the stored sign of the respective scale correction increment.

4. The method of claim 3 wherein the correction increment addresses are initially stored in a main memory of said high ranking measuring system and are then transferred to a read-only memory constituting said correction data memory.

5. The method defined in claim 3 wherein said scale is scanned successively in mutually opposite directions and said scale corrections increments are stored in dependence upon the scanning direction and are read in dependence upon the scanning direction.

6. A circuit arrangement digitally measuring displacement which comprises:
a scale having periodically repeating graduations separated by fixed increments;
a scanner responsive to said scale and displaceable relative to said scale for scanning said graduations and measuring relative displacement of said scanner and said scale;

a signal processor receiving signals from said scanner for eliminating direct-current components and equalizing levels of said signals;

a measured value computer connected to said signal processor;

a signal generator connected to said measured value computer for generating an output representing said displacement;

a higher ranking measuring system scanning said scale upon relative displacement of said scanner and said scale for generating for corresponding locations of said scale scanned by said scanner, values representing scale displacement with a higher resolution and higher accuracy than that of said scanner;

a comparator for comparing measured value signals from said signal processor and from said high ranking measuring system corresponding to identical ones of said locations and generating scale correction increments representing differences of the compared signals; and a correction data memory connected to said comparator for storing information representing only addresses assigned to said locations at which said scale correction increments exceed a predetermined threshold and the sign for each said scale correction increment representing whether said increment lies above or below a measured value derived from said scanner said correction data memory consisting of a respective address memory for each of said signs and receiving the respective address at which scale correction increments are required, said measured value computer addressing said correction data memory at each said location and algebraically adding a corresponding correction increment at the respective address to a corresponding measured value from said signal processor to produce a value which is delivered to said signal generator and represents the actual relative displacement of said scanner and said scale.

7. The circuit defined in claim 6, further comprising an interpolation computer between said signal processor and said measured value computer for interpolating measured values between a measured value corresponding to each graduation and a measured value intended to correspond to a following graduation in the direction of scan of said scale and said scanner.

8. The circuit defined in claim 7 wherein said comparator is connected to a correction data computer and a memory receiving the addresses of scale correction increments which exceed said predetermined threshold for storage of said scale correction increments which exceed said threshold until said addresses are transferred to said correction data memory.

* * * * *